(12) United States Patent
Honda

(10) Patent No.: US 7,744,381 B2
(45) Date of Patent: Jun. 29, 2010

(54) ELECTRONIC DEVICE INCLUDING PRINTED CIRCUIT BOARD, CONNECTOR AND CASING

(75) Inventor: Takayoshi Honda, Nagoya (JP)

(73) Assignee: DENSO CORPORATION, Kariya (JP)

(*) Notice: Subject to any disclaimer, the term of this patent is extended or adjusted under 35 U.S.C. 154(b) by 51 days.

(21) Appl. No.: 12/222,327

(22) Filed: Aug. 7, 2008

(65) Prior Publication Data
US 2009/0068862 A1 Mar. 12, 2009

(30) Foreign Application Priority Data
Sep. 10, 2007 (JP) ............... 2007-234551

(51) Int. Cl.
*H01R 12/00* (2006.01)
(52) U.S. Cl. ........................................ 439/79
(58) Field of Classification Search ............. 439/79, 439/587, 589, 936; 361/709, 719
See application file for complete search history.

(56) References Cited

U.S. PATENT DOCUMENTS

| | | | | |
|---|---|---|---|---|
| 5,295,044 | A | * | 3/1994 | Araki et al. .............. 361/709 |
| 6,144,273 | A | * | 11/2000 | Satoh et al. ............. 335/207 |
| 6,407,925 | B1 | | 6/2002 | Kobayashi et al. |
| 6,707,678 | B2 | | 3/2004 | Kobayashi et al. |
| 7,144,275 | B2 | * | 12/2006 | Iida ....................... 439/587 |
| 7,364,438 | B2 | * | 4/2008 | Sasaki et al. ............ 439/76.1 |

FOREIGN PATENT DOCUMENTS

| | | |
|---|---|---|
| JP | 7-263875 A | 10/1995 |
| JP | 3082811 U | 10/2001 |
| JP | A-2003-063325 | 3/2003 |

OTHER PUBLICATIONS

U.S. Appl. No. 11/979,968, filed Nov. 13, 2007, Honda.
U.S. Appl. No. 11/979,972, filed Nov. 13, 2007, Honda.
U.S. Appl. No. 12/222,321, filed Aug. 7, 2008, Honda et al.
Office Action dated Sep. 8, 2009 from Japan Patent Office in corresponding JP application No. 2007-234551 (and English translation).

* cited by examiner

*Primary Examiner*—Jean F Duverne
(74) *Attorney, Agent, or Firm*—Posz Law Group, PLC

(57) ABSTRACT

An electronic device includes a printed circuit board, a connector mounted on the printed circuit board, a casing, and a sealing member. The casing houses the printed circuit board and a part of the connector in such a manner that the other part of the connector protrudes to an outside of the casing. The casing has a casing-side recess portion and a casing-side protruding portion that are connected each other to have a loop shape. The housing has a connector-side protruding portion and a connector-side recess portion that are connected to each other to have a loop shape. The connector-side protruding portion is fitted into the casing-side recess portion through the sealing member and the casing-side protruding portion is fitted into the connector-side recess portion through the sealing member.

15 Claims, 8 Drawing Sheets

ELECTRONIC DEVICE INCLUDING PRINTED CIRCUIT BOARD, CONNECTOR AND CASING

CROSS REFERENCE TO RELATED APPLICATIONS

The present application is based on and claims priority to Japanese Patent Application No. 2007-234551 filed on Sep. 10, 2007, the contents of which are incorporated in their entirety herein by reference.

BACKGROUND OF THE INVENTION

1. Field of the Invention

The present invention relates to an electronic device that includes a printed circuit board, a connector mounted on the printed circuit board, and a casing for housing the printed circuit board and a part of the connector.

2. Description of the Related Art

According to the prior art, an electronic device includes a printed circuit board, a connector mounted on the printed circuit board, and a casing for housing the printed circuit.

For example, in each electronic control device disclosed in U.S. Pat. No. 6,707,678 (corresponding to JP-A-2001-85858 and JP-A-2001-85866), a casing includes a casing body and a cover. The casing body has an opening portion on an upper surface portion and houses an electronic circuit unit therein. The cover is disposed to close the opening portion of the casing body. The casing body has a connector opening at a sidewall thereof. The connector opening communicates with the opening portion. A part of the connector protrudes from the connector opening to an outside of the casing in a state where the printed circuit board is housed in the casing. A sealing member is disposed between an open edge portion of the casing body and a flange portion of the cover and between an inner surface of the connector opening and an outer surface of the connector, respectively.

In one electronic control device disclosed in U.S. Pat. No. 6,707,678, the connector has a groove at an upper surface thereof and a protruding portion at a lower surface thereof. However, side surfaces of the connector are substantially flat. In addition, side portions of the connector opening that face the side surfaces of the connector are also substantially flat. Thus, in a case where a sealing part has a substantially constant width, leak paths at a part of the sealing part located between the side surfaces of the connector and the side portions of the connector opening are shorter than a leak path at the other part of the sealing part. Furthermore, contact areas between the sealing member and the side surfaces of the connector and the constant areas between the sealing member and the side portions of the connector opening are reduced compared with the other portion. Thus, it is difficult to improve a sealing property, i.e., waterproof property of the casing while reducing a dimension of the electronic control device in a direction where the connector is fitted with an external connector.

In another electronic control device disclosed in U.S. Pat. No. 6,707,678, one of the side surfaces of the connector and the side portions of the connector opening are substantially flat and the other one have protruding portions. The protruding portions are disposed to provide predetermined clearances between the side surfaces of the connector and the side portions of the connector opening. Thus, even though the protruding portions are disposed, the lengths of the leak paths are not increased and the constant areas with the sealing member change little. In addition, in a case where the protruding portion comes in contact with the flat portion only one side due to a tolerance or a displacement, the clearance on the other side may become large. Thereby, the sealing member may run short and the sealing property may be reduced.

SUMMARY OF THE INVENTION

In view of the foregoing problems, it is an object of the present invention to provide an electronic device that can improve a sealing property.

According to an aspect of the invention, an electronic device includes a printed circuit board, a connector, a casing, and a sealing member. The printed circuit board has a first surface and a second surface and includes a plurality of lands. The connector is disposed on the first surface of the printed circuit board and includes a housing and a plurality of terminals. The plurality of terminals is arranged in the housing and is electrically coupled with the plurality of lands respectively for electrically coupling the printed circuit board and an external connector. The casing includes a first case disposed on the first-surface side of the printed circuit board and second case disposed on the second-surface side of the printed circuit board. The casing has a connector opening defined by an open edge portion of the first case and an open edge portion of the second case. The casing houses the printed circuit board and a part of the connector in such a manner that the other part of the connector protrudes from the connector opening to an outside of the casing. The sealing member is disposed between a peripheral edge portion of the first case and an peripheral edge portion of the second case and between the open edge portions of the casing and a surface of the housing so that an inside of the casing is waterproof. The casing has a sealing part coming in contact with the sealing member and the sealing part of the casing includes a casing-side recess portion and a casing-side protruding portion. The casing-side recess portion extends from one longitudinal end to the other longitudinal end of the open edge portion of one of the cases. The casing-side protruding portion extends from one longitudinal end to the other longitudinal end of the open edge portion of the other case. The housing has a sealing part coming in contact with the sealing member and extending on the surface of the housing so as to have a loop shape. The sealing part of the housing includes a connector-side protruding portion and a connector-side recess portion that are connected to each other. The connector-side protruding portion is fitted into the casing-side recess portion through the sealing member. The casing-side protruding portion is fitted into the connector-side recess portion through the sealing member.

In the present electronic device, a sealing property can be improved without increasing a dimension of the electronic device in a direction where the connector is fitted with the external connector.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

An electronic control device 100 according to an exemplary embodiment of the invention will be described with reference to FIGS. 1-14.

The electronic control device 100 has a waterproof structure and can be suitably used as an electronic control unit disposed outside of a vehicle compartment. For example, the electronic control device 100 can be used as an engine control unit (engine ECU) disposed in an engine room.

Figure 1:
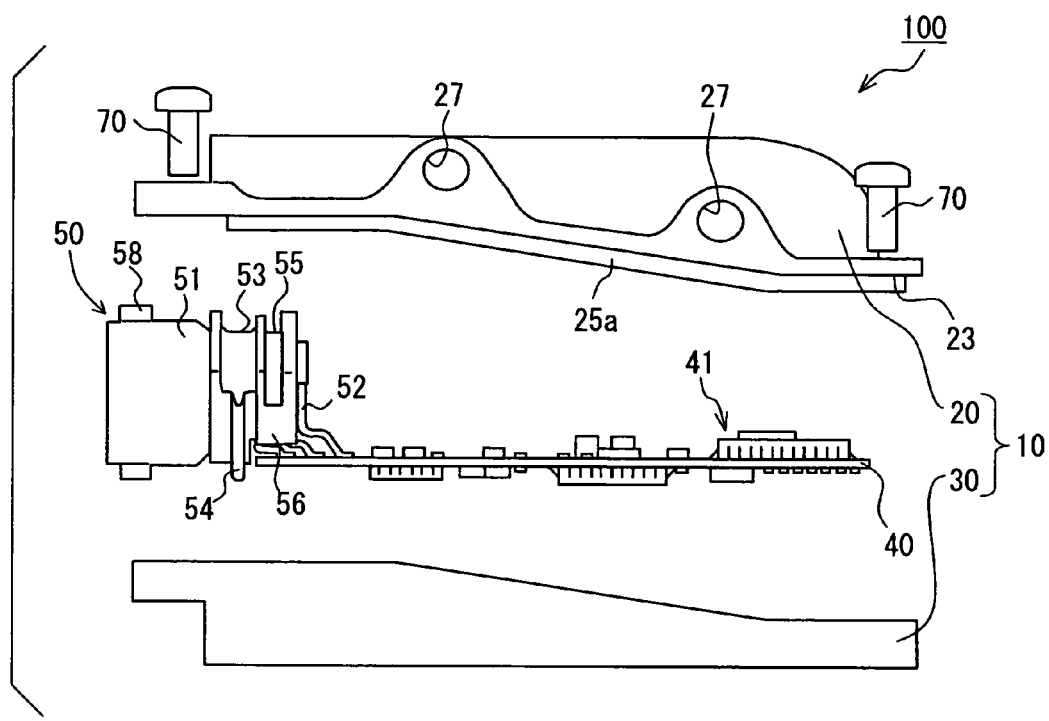
FIG. 1 is an exploded view illustrating an electronic control device according to an exemplary embodiment of the invention.
Figure 2:
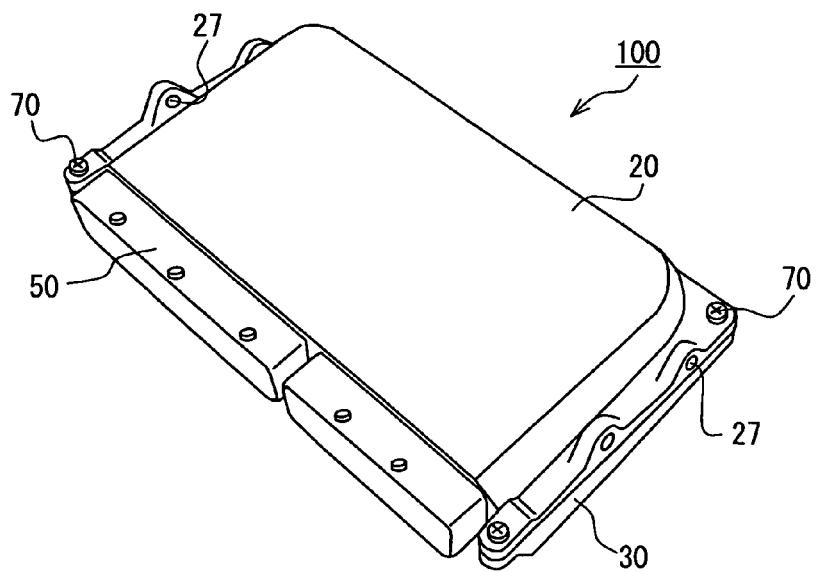
FIG. 2 is a perspective view illustrating the electronic control device.
Figure 3:
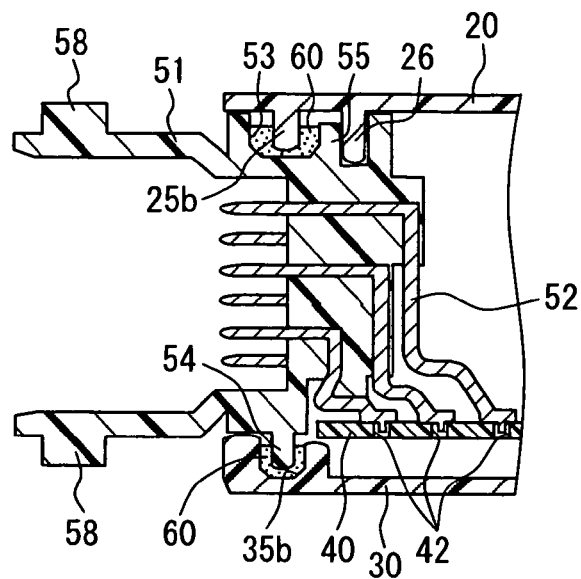
FIG. 3 is a cross-sectional view illustrating a part of the electronic control device in the vicinity of a sealing part of a connector.

As illustrated in FIGS. 1-3, the electronic control device includes a casing 10, a printed circuit board 40 housed in the casing 10, and a connector 50 mounted on the printed circuit board 40, and a sealing member 60 for waterproofing the casing 10. The connector 50 is housed in the casing 10 in such a manner that a part of the connector 50 protrudes to an outside of the casing 10.

The casing 10 includes an upper case 20 and a lower case 30. The connector 50 is mounted on an upper surface of the printed circuit board 40. The upper case 20 is arranged on the upper-surface side of the printed circuit board 40 and the lower case 30 is arranged on a lower-surface side of the printed circuit board 40.

Figure 4:
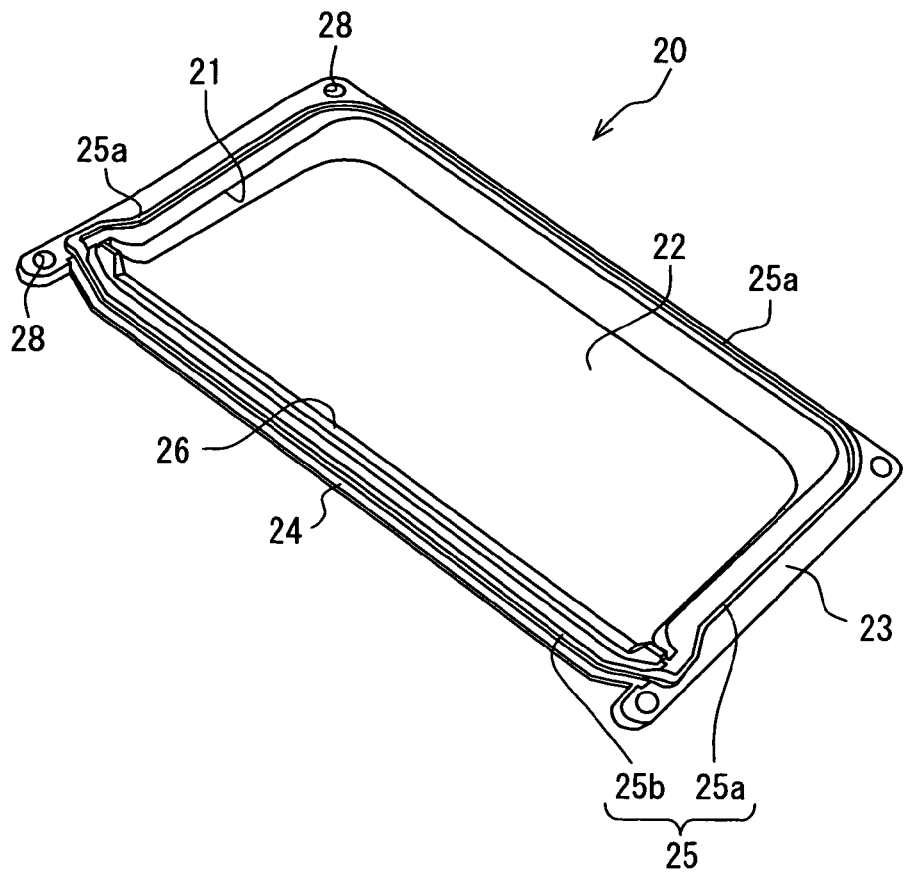
FIG. 4 is a perspective view illustrating an upper case viewed from an inside.

As illustrated in FIG. 4, the upper case 20 has an opening portion 21 that opens toward the lower case 30. The upper case 20 is formed by aluminum die casting, pressing, or resin molding, for example. The upper case 20 has a bottom surface 22 that has an approximately rectangular shape. At three side portions of the approximately rectangular shape, a flange portion 23 is disposed. The flange portion 23 faces a fixing portion of the lower case 30 through a sidewall of the upper case 20. The other one side portion of the approximately rectangular shape, an open edge portion 24 is disposed. The open edge portion 24 has an approximately trapezoid shape. The open edge portion 24 is coupled with the flange portion 23 at two longitudinal ends thereof. The upper case 20 has an approximately dustpan-shape, in which an opposite surface of the bottom surface 22 and one side of the sidewall are open and the flange portion 23 and the open edge portion 24 surround the bottom surface 22 and the sidewall. A sealing part that comes in contact with the sealing member 60 is provided at the flange portion 23, i.e., a peripheral edge portion of the upper case 20 and the open edge portion 24 so as to have a loop shape surrounding the bottom surface 22 and the opening portion 21.

For example, the sealing part of the upper case 20 includes a casing-side protruding portion 25. The casing-side protruding portion 25 includes a first protruding part 25a and a second protruding part 25b. The first protruding part 25a protrudes from a surface of the flange portion 23 toward the lower case 30 and extends from one longitudinal end to the other longitudinal end of the flange portion 23. The second protruding part 25b protrudes from a surface of the open edge portion 24 toward the lower case 30 and extends from one longitudinal end to the other longitudinal end of the open edge portion 24. The first protruding part 25a and the second protruding part 25b are connected to each other at the longitudinal ends of the flange portion 23 so as to have the loop shape.

At the open edge portion 24, a fitting projection 26 is disposed between the bottom surface 22 and the second protruding part 25b. The fitting projection 26 extends from the one longitudinal end to the other longitudinal end of the open edge portion 24 and is arranged approximately parallel to the second protruding part 25b. A protruding height of the fitting projection 26 from the surface of the open edge portion 24 is larger than a protruding height of the second protruding part 25b from the surface of the open edge portion 24.

As illustrated in FIGS. 1 and 2, the upper case 20 has a plurality of attaching holes 27 for attaching the electronic control device 100 to the vehicle by using brackets (not shown). In addition, as illustrated in FIG. 4, the upper case 20 has a plurality of screw holes 28 for fixing the upper case 20 and the lower case 30 by using screws 70.

Figure 5:
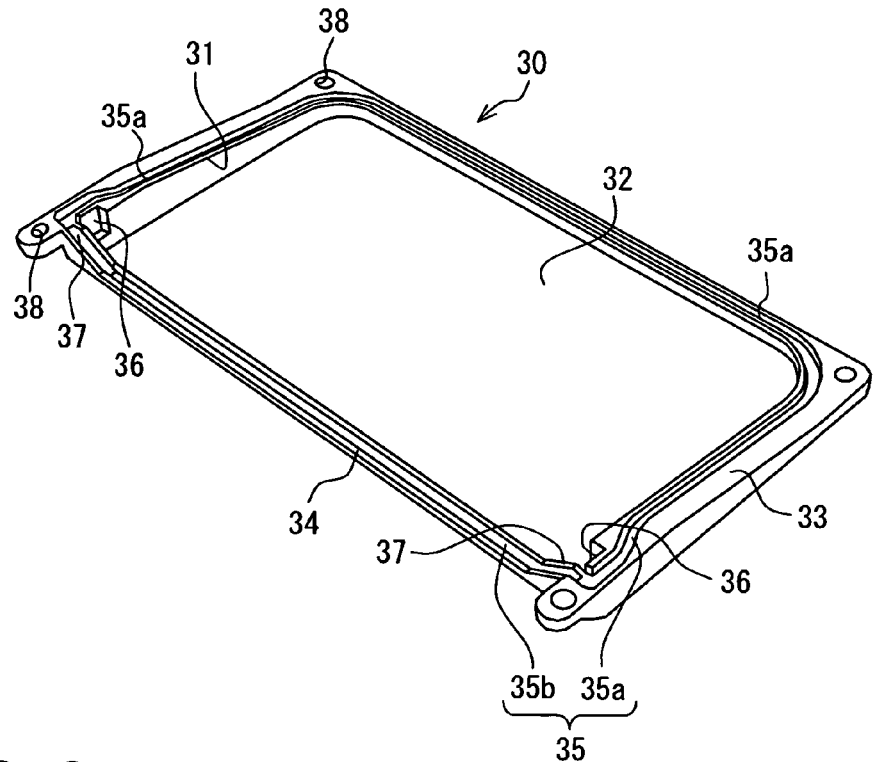
FIG. 5 is a perspective view illustrating a lower case viewed from an inside.

As illustrated in FIG. 5, the lower case 30 has an opening portion 31 that opens toward the upper case 20. The lower case 30 is formed by aluminum die casting, pressing, or resin molding, for example. The lower case 30 has a bottom surface 32 that has an approximately rectangular shape. At three side portions of the approximately rectangular shape, a flange portion 33 is disposed. The flange portion 33 faces a fixing portion of the upper case 20, i.e., the flange portion 23 of the upper case 20, through a sidewall of the lower case 30. The other one side portion of the rectangular shape, an open edge portion 34 is disposed. The open edge portion 34 has an approximately trapezoid shape. The open edge portion 34 is coupled with the flange portion 33 at two end portions thereof. That is, the lower case 30 also has an approximately dustpan-shape, in which an opposite surface of the bottom surface 32 and one side of the sidewall are open and the flange portion 33 and the open edge portion 34 surround the bottom surface 32 and the sidewall. A sealing part that comes in contact with the sealing member 60 is provided at the flange portion 33, i.e., a peripheral edge portion of the lower case 30 and the open edge portion 34 so as to have a loop shape surrounding the bottom surface 32 and the opening portion 31.

For example, the sealing part of the lower case 30 includes a casing-side recess portion 35. The casing-side recess portion 35 includes a first recess part 35a and a second recess part 35b. The first recess part 35a is provided at a surface portion of the flange portion 33 so as to correspond the first protruding part 25a of the upper case 20. The first recess part 35a extends from one longitudinal end to the other longitudinal end of the flange portion 33. The second recess part 35b is provided at a surface portion of the open edge portion 34. The second recess part 35b extends from one longitudinal end to the other longitudinal end of the open edge portion 34. The first recess part 35a and the second recess part 35b are connected to each other at the longitudinal ends of the flange portion 33 so as to have the loop shape. A width of the first recess part 35a is larger than a width of a width of the first protruding part 25a of the upper case 20 so that the first protruding part 25a can be inserted into the first recess part 35a in a state where the sealing member 60 is filled in the first recess part 35a.

Furthermore, the lower case 30 has fitting grooves 36 at connecting parts of the open edge portion 34 with the flange portion 33. For example, the fitting grooves 36 are provided at a sidewall of the open edge portion 34.

Figure 6:
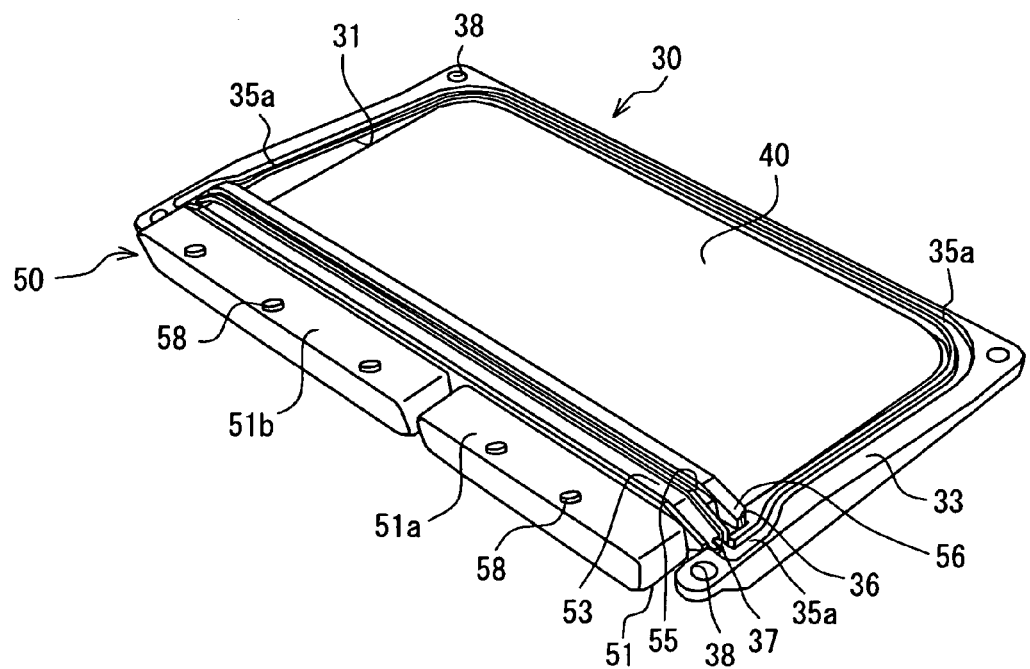
FIG. 6 is a perspective view illustrating a printed circuit board attached to the lower case.
Figure 7:
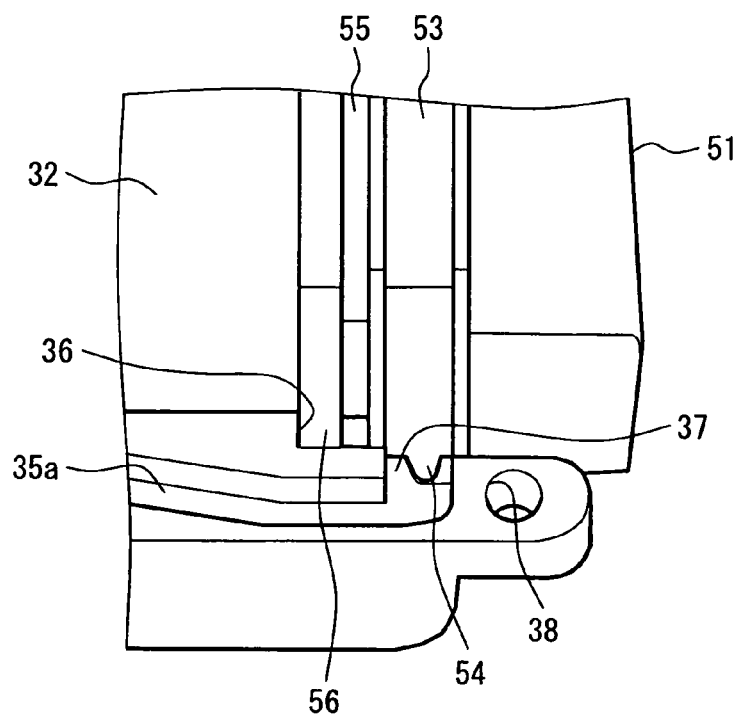
FIG. 7 is an enlarged view illustrating a longitudinal end portion of the connector.
Figure 8:
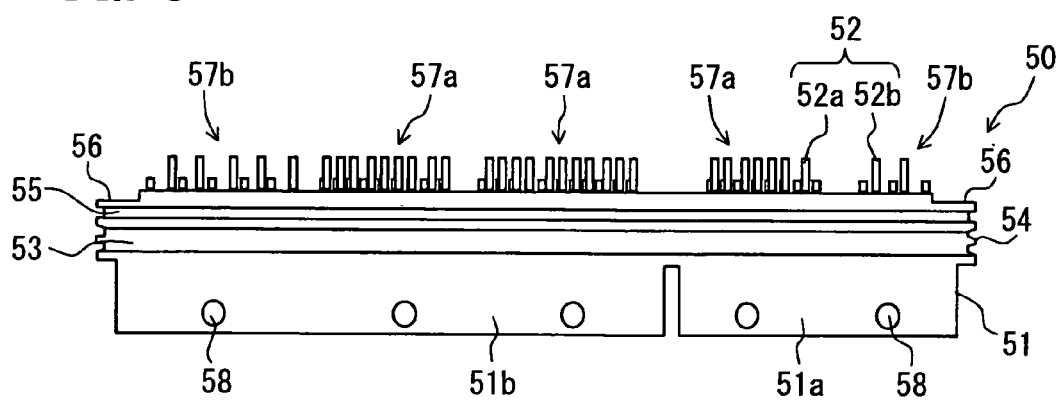
FIG. 8 is a plan view illustrating the connector viewed from the upper-case side.

As illustrated in FIGS. 5-7, at the longitudinal ends of the open edge portion 34 of the lower case 30, nesting parts 37 are disposed. The nesting parts 37 protrude toward the upper case 20. Sidewalls of the nesting parts 37 on the bottom-surface side become sidewalls of the fitting grooves 36.

The lower case 30 has a plurality of screw holes 38 for fixing the upper case 20 and the lower case 30 by using the screws 70.

The printed circuit board 40 has wirings and via holes for coupling the wirings. The wirings include lands as electrodes. On the upper surface of the printed circuit board 40, a plurality of electronic elements 41 is mounted. The electronic elements 41 include a microcomputer, a power transistor, a resistor, and a capacitor, for example. The connector 50 for coupling the printed circuit board 40 to an external device is mounted on the printed circuit board 40 as one of the electronic elements 41.

The printed circuit board 40 may be made of thermoplastic resin, thermosetting resin, ceramics, or a complex of glass (e.g., glass fabric) and resin, for example. The number of layer of the printed circuit board 40 is not limited. The printed circuit board 40 has a plurality of through holes 42 that extends from the upper surface to the lower surface. The connector 50 has a plurality of terminals 52. An end portion of each terminal 52 is inserted into corresponding through hole 42. A coupling structure of the terminals 52 with the printed circuit board 40 have a part in common with a coupling structure disclosed in JP-A-2007-148613 (corresponding to U.S. patent application Ser. No. 11/979968) by the inventor. Thus, a detail description of the coupling structure is omitted.

The connector 50 has a housing 51 and the terminals 52 arranged in the housing 51. The housing 51 is made of an insulating material. The terminals 52 are made of a conductive material. The end portions of the terminals 52 extend from the housing 51 and are coupled with the lands (not shown) of the printed circuit board 40 through a solder.

The terminals 52 include first terminals 52a, second terminals 52b, and at least one third terminal 52c, e.g., three third terminals 52c. The first terminals 52a and the second terminals 52 have an electric coupling function between the printed circuit board 40 and the connector 50. One end portions of the first terminals 52a and the second terminals 52b extending from the housing 51 are electrically and mechanically coupled with the lands of the printed circuit board 40 through the solder. The other end portions of the first terminals 52a and the second terminals 52b extending from the housing 51 are electrically coupled with the external connector. The third terminals 52c do not have an electric coupling function between the connector 50 and the printed circuit board 40. The third terminals 52c are provided for improving a connectivity of the connector 50 with the printed circuit board 40.

As illustrated in FIG. 1, FIG. 3, and FIGS. 6-9, the housing 51 has a sealing part coming in contact with the sealing member 60 and extending on a surface of the housing so as to have a loop shape. For example, the sealing part of the housing 51 includes a connector-side recess portion 53 and a connector-side protruding portion 54 that are connected to each other. The connector-side recess portion 53 corresponds to the second protruding part 25b of the upper case 20. The connector-side protruding portion 54 corresponds to the second recess part 35b of the lower case 30. At the connecting parts of the connector-side recess portion 53 with the connector-side protruding portion 54, a center portion of the connector-side recess portion 53 and a center portion of the connector-side protruding portion 54 are aligned. A width of the connector-side recess portion 53 is larger than a width of the second protruding part 25b of the upper case 20 so that the second protruding part 25b can be inserted into the connector-side recess portion 53 in a state where the sealing member 60 is filled in the connector-side recess portion 53. A width of the connector-side protruding portion 54 is less than a width of the second recess part 35b of the lower case 30 so that the connector-side protruding portion 54 can be inserted into the second recess part 35b in a state where the sealing member 60 is filled in the second recess part 35b. The sealing part of the housing 51 has an approximately hexagonal contour. An upper surface portion and a lower surface portion of the sealing part oppose to each other and are approximately parallel to the upper surface of the printed circuit board. The connector-side recess portion 53 and the connector-side protruding portion 54 are connected to each other at two vertices of the approximately hexagonal contour. That is, the connector-side recess portion 53 is provided at the upper surface portion and two surface portions adjacent to the upper surface portion. The connector-side protruding portion 54 is provided at the lower surface portion and two surface portions adjacent to the lower surface portion.

The nesting parts 37 of the lower case 30 are locked into an inner wall of the connector-side recess portion 53 at the connecting parts of the connector-side recess portion 53 and the connector-side protruding portion 54. Thereby, a length of a leak path can be increased and a sealing property of the electronic control device 100 can be improved.

On the upper surface of the housing 51, a fitting groove 55 is provided to correspond to the fitting projection 26 provided at the open edge portion 24 of the upper case 20. The fitting groove 55 is provided in a longitudinal direction of the housing 51. The fitting groove 55 has a length substantially similar to the connector-side recess portion 53 and is arranged approximately parallel to the connector-side recess portion 53. At the longitudinal ends of the housing 51, fitting projections 56 are disposed to correspond to the fitting grooves 36 provided in the lower case 30. Surface portions of the housing 51 at which the fitting groove 55 and the fitting projections 56 are provided have contours that are different from the approximately hexagonal contour of the sealing part. In addition, the housing 51 has a plurality of protruding portions 58 on an outer surface thereof so that the external connector can be fitted with the connector 50.

Figure 9:
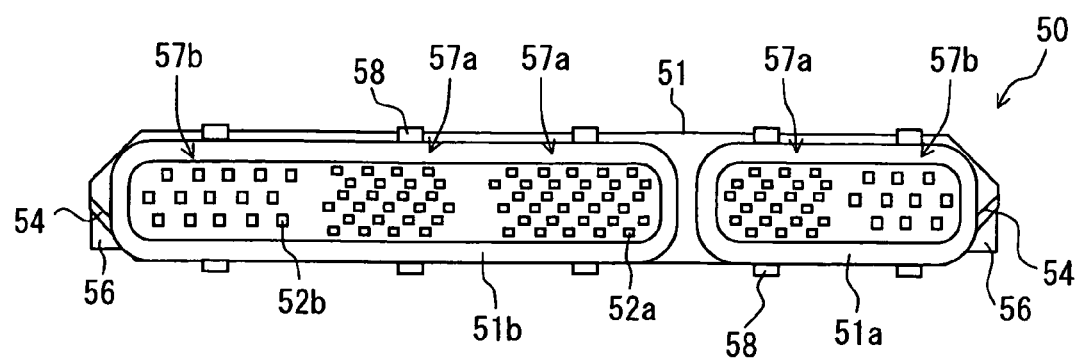
FIG. 9 is a plan view illustrating the connector viewed from a side where an external connector is fitted.

The terminals 52 are arranged in the housing 51 in a zigzag manner in the longitudinal direction of the housing 51. In addition, the terminals 52 are arranged in a plurality of rows in a direction perpendicular to the upper surface of the printed circuit board 40, i.e., in a thickness direction of the printed circuit board 40. For example, the plurality of rows is greater than or equal to three rows. As illustrated in FIG. 3, the terminals 52 extend from the housing 51 in such a manner a distance between a portion of the housing 51 where the external connector is fitted with and a portion of the housing 51 where each terminal 52 extends from increases toward an opposite side of the upper surface of the printed circuit board 40. That is, a length of a portion of each terminal 52 embedded in the housing 51 increases upward. In the terminals 52, the first terminals 52a are signal terminals for transmitting signals. The second terminals 52b, which are thicker than the first terminals 52a, are power terminals for transmitting electricity from a power element. As illustrated in FIG. 9, the first terminals 52a are arranged in six rows in the direction perpendicular to the upper surface of the printed circuit board 40. The second terminals 52b are arranged in three rows in the direction perpendicular to the upper surface of the printed circuit board 40. The connector 50 has first terminal blocks 57a and second terminal blocks 57b arranged in the longitudinal direction of the housing 51. In the first terminal blocks 57a, only the first terminals 52a are arranged. In the second terminal blocks 57b, only the second terminals 52b are arranged. For example, in the longitudinal direction of the housing 51, three first terminal blocks 57a are arranged between two second terminal blocks 57b. In addition, the connector 50 has a first connection port 51a and a second connection port 51b to be coupled with the external connector. In the first connection port 51a, one of the first terminal blocks 57a and one of the second terminal blocks 57b are arranged. In the second connection port 51b, two of the first terminal blocks 57a and one of the second terminal blocks 57b are arranged.

Figure 10:
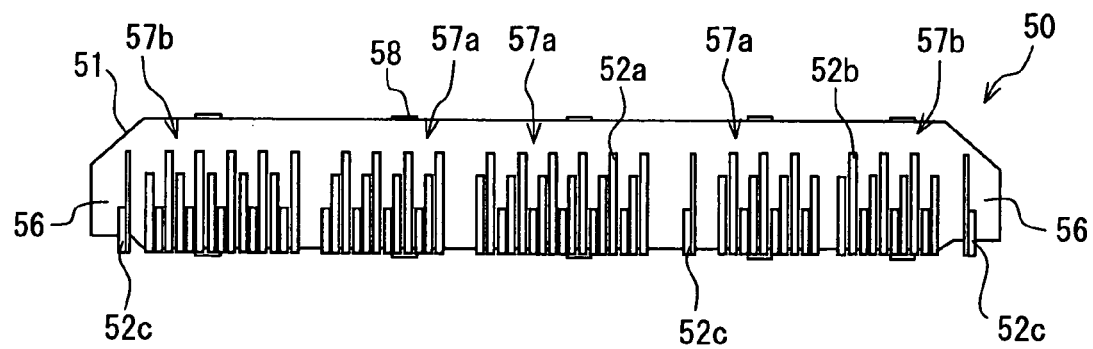
FIG. 10 is a plan view illustrating the connector viewed from a side where a printed circuit board is coupled.
Figure 11:
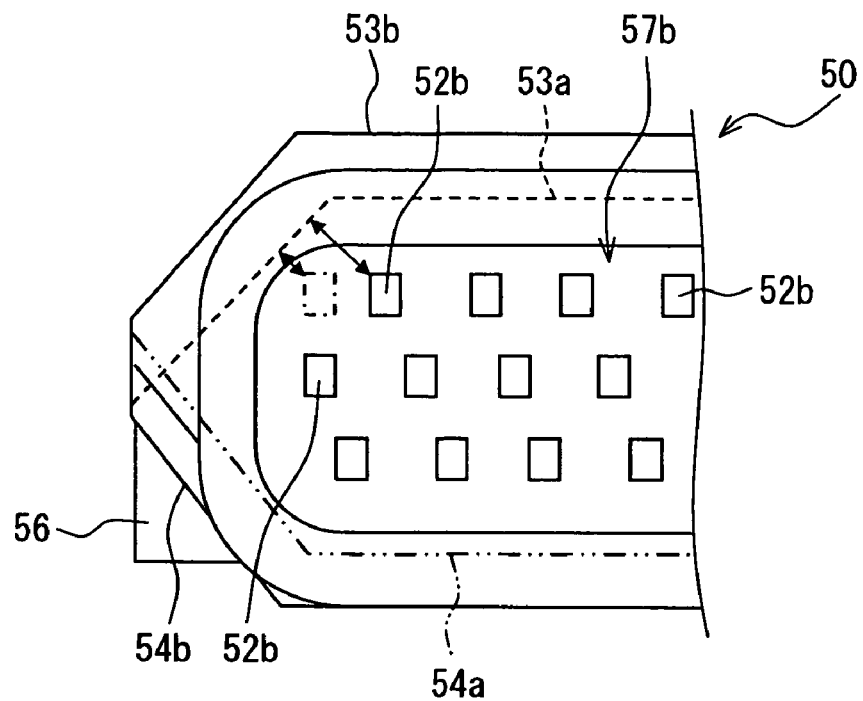
FIG. 11 is an enlarged view illustrating a longitudinal end portion of a housing of the connector.

As illustrated in FIGS. 9-11, in the second terminal block 57b arranged adjacent to one longitudinal end of the housing 51, each of the three rows has an end second terminal 52b that is closest to the one longitudinal end of the housing 51 among the second terminals 52b in each row. Among the end second terminals 52b, the end second terminal 52b arranged in the middle row (i.e., second row) in the thickness direction of printed circuit board 40 is closest to the one longitudinal end of the housing 51 and the end second terminal 52b arranged in the highest row (i.e., third row) is farthest from the one longitudinal end of the housing 51.

The third terminals 52c are reinforcing terminals. Each third terminal 52c has only one end portion that extends from the housing 51 and is coupled with the land of the printed circuit board 40. For example, in the longitudinal direction of the housing 51, two of the third terminals 52c are arranged outside of the second terminal blocks 57b respectively, and one of third terminal 52c are arranged between the first connection port 51a and the second connection port 51b. Each terminal 52 (52a-52c) is a branch terminal that has an insertion section to be inserted into a through hole 42 provided in the printed circuit board 40 and a surface section to be disposed on the upper surface of the printed circuit board 40.

The sealing member 60 is made of a material that can produce a sealing effect so that the space in the casing 10 becomes waterproof. For example, the sealing member 60 is made of a material that has adhesiveness and that can bond the upper case 20 and the lower case 30, the upper case 20 and the housing 51 of the connector 50, and the lower case 30 and the housing 51 of the connector 50 by curing. Alternatively, the sealing member 60 may be made of a material that has a low adhesiveness and a high repelling force (i.e., elasticity) so that clearances can be filled by the repelling force. Alternatively, the sealing member 60 may be made of a material that has a high adhesiveness and a high repelling force. For example, the sealing member 60 is made of a moisture-curing silicone adhesive having a viscosity in a range from about 150 Pa·s to about 200 Pa·s before curing.

Figure 12:
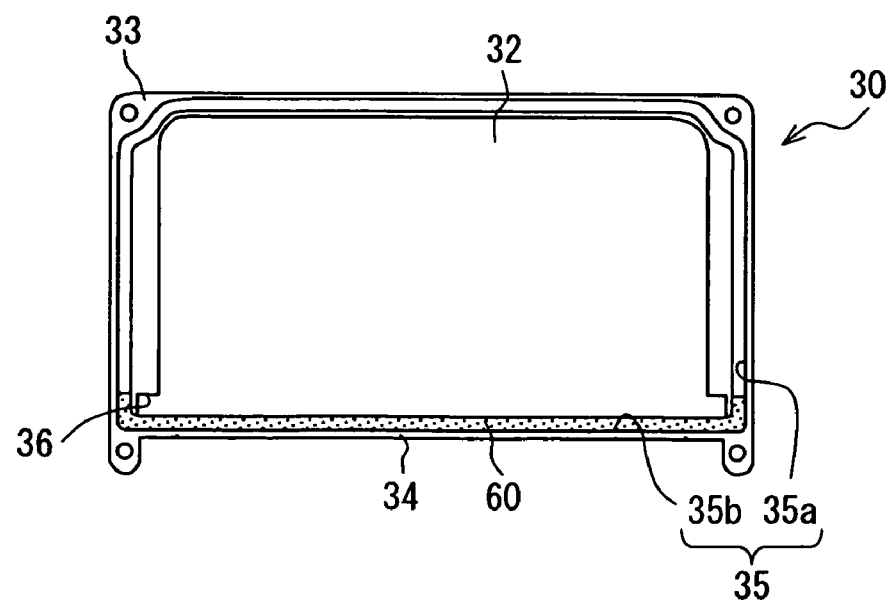
FIG. 12 is a plan view illustrating the lower case at a step of an assembling process.
Figure 13:
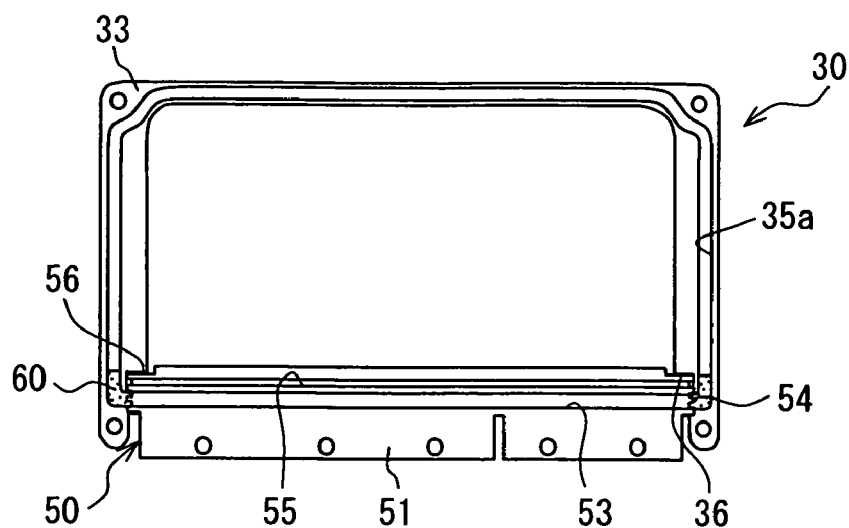
FIG. 13 is a plan view illustrating the connector and the lower case at another step of the assembling process.

An assembling process of the electronic control device 100 will now be described. At first, as illustrated in FIG. 12, the sealing member 60 is applied to the second recess part 35b provided at the open edge portion 34 of the lower case 30. Next, as illustrated in FIG. 13, the fitting projections 56 of the housing 51 are fitted into the fitting grooves 36 of the lower case 30. In addition, the connector-side protruding portion 54 is inserted into the second recess part 35b of the lower case 30 so that the connector-side protruding portion 54 comes in contact with the sealing member 60 applied to the second recess part 35b. Thereby, the printed circuit board 40 on which the electronic elements 41 including the connector 50 are mounted is disposed on the lower case 30. In FIG. 13, the printed circuit board 40 is not illustrated. In the present state, the connector-side recess portion 53 communicates with the first recess part 35a of the lower case 30.

Figure 14:
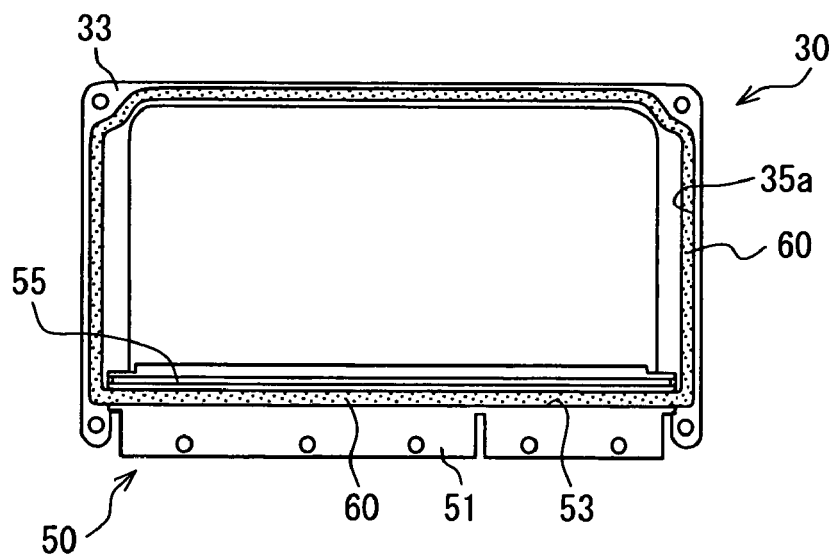
FIG. 14 is a plan view illustrating the connector and the lower case at another step of the assembling process.

Thus, after the printed circuit board 40 is disposed on the lower case 30, the sealing member 60 is applied to the connector-side recess portion 53 and the first recess part 35a of the lower case 30 at a time, as illustrated in FIG. 14. Next, the fitting projection 26 of the upper case 20 is fitted into the fitting groove 55 provided at the housing 51. In addition, the first protruding part 25a and the second protruding part 25b of the casing-side protruding portion 25 are inserted into the first recess part 35a and the connector-side recess portion 53, respectively, so that the casing-side protruding portion 25 comes in contact with the sealing member 60. Thereby, the upper case 20 is disposed on the lower case 30 in such a manner that the opening portion 31 of the lower case 30 is covered by the upper case 20. Furthermore, a connector opening of the casing 10 is defined by the open edge portion 24 of the upper case 20 and the open edge portion 34 of the lower case 30, and the casing 10 houses the printed circuit board 40 and a part of the connector 50 in such a manner that the other part of the connector 50 protrudes from the connector opening to the outside of the casing 10. Then, the screws 70 are inserted into the screw holes 28 and 38 and are fastened.

In the above-described process, the fitting projection 26 is fitted into the fitting groove 55 of the housing 51 before the second protruding part 25b is inserted into connector-side recess portion 53 of the housing 51 because the protruding height of the fitting projection 26 is larger than the protruding height of the second protruding part 25b.

As described above, the first protruding part 25a is formed at the flange portion 23 of the upper case 20 and the first recess part 35a is formed at the flange portion 33 of the lower case 30. The flange portion 23 of the upper case 20 faces the flange portion 33 of the lower case 30, and at least a part of the first protruding part 25a is inserted into the sealing member 60 in the first recess part 35a. In addition, the second protruding part 25b is formed at the open edge portion 24 of the upper case 20 and the connector-side recess portion 53 is formed at the housing 51 of the connector 50 so that at least a part of the second protruding part 25b is buried in the sealing member 60 in the connector-side recess portion 53. Furthermore, the second recess part 35b is formed at the open edge portion 34 of the lower case 30 and the connector-side protruding portion 54 is formed at the housing 51 of the connector 50 so that at least a part of the connector-side protruding portion 54 is buried in the sealing member 60 in the second recess part 35b. Thereby, the space in the casing 10 is sealed to be airproof.

In the electronic control device 100, at the surface portion of the housing 51 that faces the open edge portions 24 and 34, the connector-side recess portion 53 and the connector-side protruding portion 54 are continuously formed to have the loop shape. In addition, in a state where the upper case 20 and the lower case 30 are assembled into the casing 10, the second protruding part 25b and the second recess part 35b are provided at the whole circumference of the open edge portions 24 and 34 so as to have a loop shape. Thus, the length of the leak path increases at the whole circumference of the sealing part on the surface portion of the housing 51, and a contact area with the sealing member 60 increases. Thus, the sealing property of the electronic control device 100 can be improved without increasing a width of the sealing part. As a result, the sealing property of the electronic control device 100 can be improved without increasing a dimension of the electronic control device 100 in a direction where the connector 50 is fitted with the external connector (i.e., fitting direction).

Furthermore, the first protruding part 25a is formed at the flange portion 23 of the upper case 20 in addition to the second protruding part 25b formed at the open edge portion 24. Thus, the casing-side protruding portion 25 including the first protruding part 25a and the second protruding part 25b has the loop shape surrounding the bottom surface 22. In a similar manner, the first recess part 35a is formed at the flange portion 33 of the lower case 30 in addition to the second recess part 35b formed at the open edge portion 34. Thus, the casing-side recess portion 35 including the first recess part 35a and the second recess part 35b has the loop shape surrounding the bottom surface 32. Thereby, the sealing property of the electronic control device 100 can be further improved without increasing a dimension of the electronic control device 100 in a direction along the upper surface of the printed circuit board 40.

In the present case, the casing-side protruding portion 25 is only disposed in the upper case 20 and the casing-side recess portion 35 is only disposed in the lower case 30. Because both of the upper case 20 and the lower case 30 has only one of the casing-side protruding portion 25 and the lower case 30, the upper case 20 and the lower case 30 can be formed by pressing at a low cost as well as aluminum die casting and resin molding.

In a case where the length of the leak path can be increased by extending the flange portions 23 and 33 toward the opening portions 21 and 31, respectively, flat portions of the flange portions 23 and 33 may be used as at least a part of the sealing part on the flange portions 23 and 33.

The lower case 30 disposed on the lower-surface side of the printed circuit board 40 has the casing-side recess portion 35 as the sealing part that comes in contact with the sealing member 60. In addition, the connector-side protruding portion 54 is formed on the surface of the housing 51 so as to face the second recess part 35b of the casing-side recess portion 35 formed at the open edge portion 34. The width of the connector-side protruding portion 54 may be less than the width of the connector-side recess portion 53. Thus, the length of the housing 51 in the fitting direction can be reduced. Furthermore, as illustrated in FIG. 1, the printed circuit board 40 can be disposed close to the portion of the housing 51 where the external connector is fitted with. That is, the dimension of the electronic control device 100 in the fitting direction can be reduced.

As illustrated in FIG. 3, the terminals 52 are arranged in the housing 51 in such a manner that the distance between the portion of the housing 51 where the external connector is fitted with and the portion of the housing 51 where each terminal 52 extends from increases toward an opposite side of the upper surface of the printed circuit board 40. Thus, the thickness of the housing 51 in the fitting direction increases upward, that is, toward an opposite side of the upper surface of the printed circuit board 40. In this way, in the housing 51, the thickness at the portion where the connector-side recess portion 53 is formed is ensured. Thus, the connector-side recess portion 53 can be formed at the housing 51 without increasing the dimension of the electronic control device 100 in the fitting direction.

In addition, the fitting groove 55 is formed adjacent to the connector-side recess portion 53 of the housing 51. Furthermore, the fitting projection 26 is formed adjacent to the second protruding part 25b of the upper case 20 so as to correspond to the fitting groove 55. Thus, by fitting the fitting projection 26 into the fitting groove 55, a relative position of the connector 50 and the upper case 20 is determined. Thereby, a gouge of the connector 50 with respect to the casing 10, that is, a displacement of the second protruding part 25b in the connector-side recess portion 53 and a displacement of the connector-side protruding portion 54 in the second recess part 35b can be reduced in the fitting direction. In addition, the sealing member 60 is restricted from being pushed out of the connector-side recess portion 53. Because a fitting part including the fitting groove 55 and the fitting projection 26 is formed adjacent to the sealing part, a stress generated at the connector 50 can be released to the casing 10 through the fitting part. Thereby, a stress applied to the sealing part is reduced and the sealing property can be improved. Furthermore, because a stress applied to coupling potions of the terminals 52 with lands also can be reduced, an electric connectivity of the terminals 52 with the lands can be improved.

In the present case, the fitting projection 26 extends in a direction approximately parallel to the extending direction of the second protruding part 25b, as illustrated in FIG. 4. In addition, the fitting groove 55 extends in a direction approximately parallel to the extending direction of the connector-side recess portion 53. Thus, in the fitting direction, the displacement of the second protruding part 25b in the connector-side recess portion 53 and the displacement of the connector-side protruding portion 54 in the second recess part 35b can be effectively reduced while restricting an increase of the dimension of the electronic control device 100 due to providing the fitting part.

Furthermore, the fitting projections 56 are disposed at the both longitudinal end portions of the housing 51, and the fitting grooves 36 are disposed at the open edge portion 34 of the lower case 30 so as to correspond to the fitting projections 56. Thus, a fitting part including the fitting projections 56 and the fitting grooves 36 effectively restrict the displacement of the second protruding part 25b in the connector-side recess portion 53 and the displacement of the connector-side protruding portion 54 in the second recess part 35b. Especially, because the fitting part is located at the both longitudinal end portions of the housing 51, the fitting part can restrict a gouge of the housing 51 in the longitudinal direction of the housing 51.

The fitting projection 26 and the fitting groove 55 are configured in such a manner that the fitting projection 26 is inserted into the fitting groove 55 before the second protruding part 25b is inserted into the connector-side recess portion 53 when the casing 10 is assembled to house the printed circuit board 40 and the connector 50. Thus, the second protruding part 25b is inserted into the connector-side recess portion 53 in a state where the relative position of the casing 10 and the connector 50 is determined by the fitting part including the fitting projection 26 and the fitting groove 55. Thus, when the second protruding part 25b is inserted into the connector-side recess portion 53, the sealing member 60 is reduced from being pushed out of connector-side recess portion 53. Thereby, a reduction of the sealing property can be effectively restricted. In addition, the fitting grooves 36 and the fitting projections 56 are configured in such a manner that the fitting projections 56 are inserted into the fitting grooves 36 before the connector-side protruding portion 54 is inserted into the second recess part 35b. The gouge of the connector 50 with respect to the casing 10 can be effectively restricted by reducing a tolerance of the fitting projection 26 and the fitting groove 55 and a tolerance of the fitting projections 56 and the fitting grooves 36 rather than reducing a tolerance of the second protruding part 25b and the connector-side recess portion 53 and a tolerance of the connector-side protruding portion 54 and the second recess part 35b. Furthermore, when an insertion depth of the fitting projection 26 to the fitting groove 55 and an insertion depth of the fitting projections 56 to the fitting grooves 36 are larger than an insertion depth of the second protruding part 25b to the connector-side recess portion 53 and an insertion depth of the connector-side protruding portion 54 to the second recess part 35b, respectively, the gouge of the connector 50 with respect to the casing 10 can be effectively restricted.

The sealing part of the housing 51 has the approximately hexagonal contour and the upper surface portion and the lower surface portion of the sealing part are appropriately parallel to the upper surface of the printed circuit board 40. In addition, the connector-side recess portion 53 and the connector-side protruding portion 54 are coupled each other at the two vertices of the approximately hexagonal contour. Thus, the length of the housing 51 in the longitudinal direction of the housing 51 can be reduced compared with a case where the sealing part of the housing 51 has a trapezoid contour. Furthermore, the housing 51 can be fitted with the lower case 30 and the upper case 20 can be fitted with the housing 51 without scraping away the sealing member 60.

As illustrated in FIG. 11, the first terminals 52a and the second terminals 52b are arranged in the housing 51 in the zigzag manner in the longitudinal direction of the housing 51. In addition, the first terminals 52a and the second terminals 52b are arranged in the plurality of rows greater than or equal to three rows in the thickness direction of the printed circuit board 40 at least at portions adjacent to the longitudinal ends of the housing 51. In the second terminal block 57b arranged adjacent to the one longitudinal end of the housing 51, each of the three rows has the end second terminal 52b that is closest to the one longitudinal end of the housing 51 among the second terminals 52b in each row. Among the end second terminals 52b, the end second terminal 52b arranged in the middle row in the thickness direction of the printed circuit board 40 is closest to the one longitudinal end of the housing 51. That is, the second terminal 52b that is closest to the one longitudinal end of the housing 51 among the first terminals 52a and the second terminals 52b is arranged in the middle row. Thus, in the housing 51 in which the sealing part has the approximately hexagonal contour, the first terminals 52a and the second terminals 52b can be arranged to portions close to the longitudinal ends of the housing 51. Thereby, the length of the housing 51 in the longitudinal direction can be reduced.

Furthermore, in the second terminal block 57b arranged adjacent to the one longitudinal end of the housing 51, the end second terminal 52b arranged in the highest row, that is, the end second terminals 52b that is closest to the upper surface portion of the housing 51 is farthest from the one longitudinal end of the housing 51 among the end second terminals 52b. The upper case 20 has the casing-side protruding portion 25 and the housing 51 has the connector-side recess portion 53 at the upper surface portion. Because the end second terminal 52b arranged in the highest row is farthest from the one longitudinal end of the housing 51, the end second terminal 52b is difficult to interfere with a bottom surface 53a of the connector-side recess portion 53 illustrated by the dashed line in FIG. 11. Thus, the length of the housing 51 in the longitudinal direction can be reduced. In FIG. 11, the dashed-dotted line illustrates a comparative example in which the end second terminal 52b in the highest row is arranged closer to the one longitudinal end of the housing 51. The dashed-two dotted line illustrates a base of the connector-side protruding portion 54. Furthermore, a surface portion 53b surrounding the connector-side recess portion 53 and a tip 54b of the connector-side protruding portion 54 are illustrated in FIG. 11.

Other Embodiments

Although the present invention has been fully described in connection with the exemplary embodiment thereof with reference to the accompanying drawings, it is to be noted that various changes and modifications will become apparent to those skilled in the art.

In the above-described exemplary embodiment, each terminal 52 of the connector 50 is a T-shaped branch terminal including the insertion section and the surface section, as illustrated in FIG. 3. Alternatively, each terminal 52 may have one of the insertion section and the surface section. Alternatively, each terminal 52 may be a branch terminal having an inverted L-shape. Alternatively, a part of the terminals 52 may be the branch terminals.

In the above-described exemplary embodiment, the terminals 52 include the first terminals 52a, the second terminals 52b, and the third terminals 52c, as an example. The type of the terminal 52 is not limited to the above-described example. For example, the terminals 52 may not include the third terminals 52c as the reinforcing terminals. The number, the type, and the arrangement of the terminal block are not limited to the above-described example. Furthermore, the number of row and the arrangement of the terminals 52 in the housing 51 are not limited to the above-described example.

In the above-described exemplary embodiment, the electronic control device 100 is described as an example of an electronic device. However, the electronic device may be any waterproof electronic device in which the printed circuit board 40 is housed in the casing 10 including the upper case 20 and the lower case 30 and a part of the connector 50 mounted on the printed circuit board 40 protrudes from the connector opening to an outside of the casing 10.

In the above-described exemplary embodiment, the fitting projection 26 is disposed at the upper case 20 and the fitting groove 55 is disposed at the housing 51 to configurate the fitting part. In addition, the fitting grooves 36 are disposed at the lower case 30 and the fitting projections 56 are disposed at the housing 51 to configurate another fitting part. Alternatively, the electronic control device 100 may have one of the fitting parts.

In the above-described exemplary embodiment, the open edge portion 24 of the upper case 20 is formed in the whole area of one side portion of the upper case 20 and the open edge portion 34 of the lower case 30 is formed in the whole area of one side portion of the lower case 30. Alternatively, the open edge portion 24 may be formed at a part of the one side portion of the upper case 20 and the opening edge portion 34 may be formed at a part of the one side portion of the lower case 30. The shapes of the connector opening and the open edge portions 24 and 34 are not limited to the above-described example.

Figure 15:
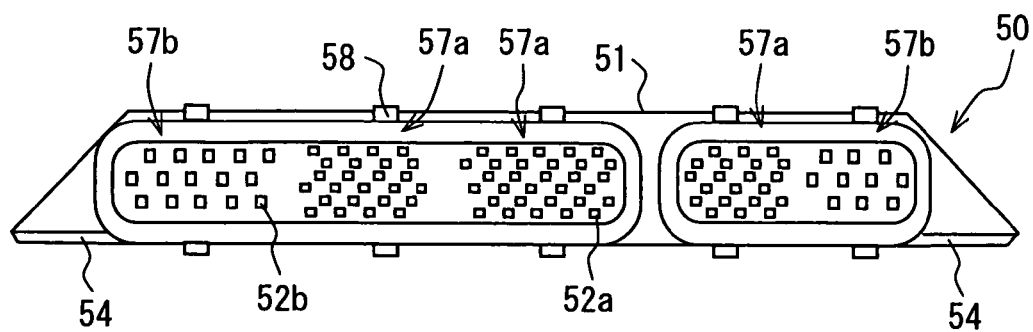
FIG. 15 is a plan view illustrating a connector according to a modification of the invention.
Figure 16:
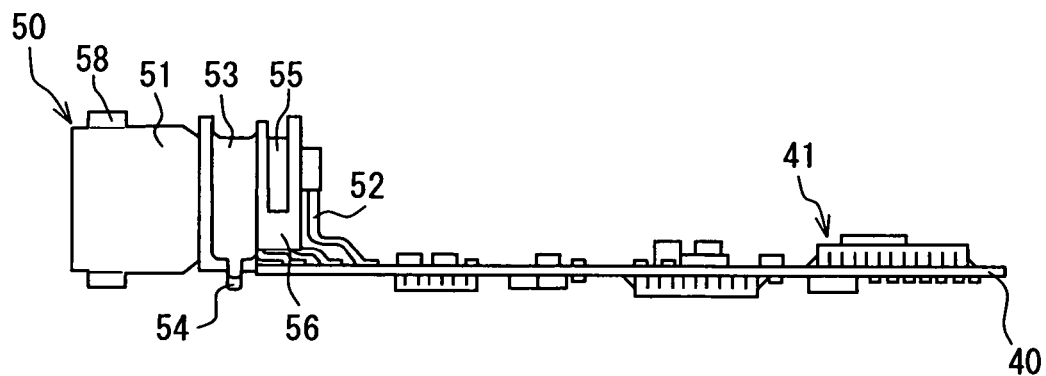
FIG. 16 is a side view illustrating the connector according to the modification.

In the above-described exemplary embodiment, the sealing part of the housing 51 has the approximately hexagonal contour, as an example. Alternatively, as illustrated in FIG. 15 and FIG. 16, the sealing part of the housing 51 may have an approximately trapezoid contour including an upper base and a lower base. For example, the lower base is longer than the upper base. In the present case, the sealing part of the lower case 30 that faces the lower base of the sealing part of the housing 51 can be disposed on one plane. Thus, the lower case 30 can have a simple structure. In addition, when the sealing part of the housing 51 has the approximately trapezoid contour, the housing 51 can be fitted with the lower case 30 and the upper case 20 can be fitted with the housing 51 without scraping away the sealing member 60 in a manner similar to a case where the sealing part of the housing 51 has the approximately hexagonal contour.

In the above-described exemplary embodiment, the upper case 20 has the casing-side protruding portion 25 and the lower case 30 has the casing-side recess portion 35. Alternatively, the upper case 20 may have a casing-side recess portion and the lower case 30 may have a casing-side protruding portion. In the present case, the connector-side protruding portion 54 and the connector-side recess portion 53 are formed on the surface of the housing 51 to correspond to the casing-side recess portion and the casing-side protruding portion, respectively.

In the above-described exemplary embodiment, the upper case 20 has the fitting projection 26 and the housing 51 has the fitting groove 55 corresponding to the fitting projection 26, as an example. Alternatively, the upper case 20 may have a fitting groove and the housing 51 may have a fitting projection. Furthermore, in the above-described exemplary embodiment, the lower case 30 has the fitting grooves 36 and the housing 51 has the fitting projections 56 corresponding to the fitting grooves 36, as an example. Alternatively, the lower case 30 may have a fitting projection and the housing 51 may have a fitting groove.

In the above-described exemplary embodiment, with respect to fitting portion of the housing 51 where the external connector is fitted with, the fitting part including the fitting projection 26 and the fitting groove 55 are farther away than the sealing part including the second protruding part 25b of the upper case 20 and the connector-side recess portion 53. Alternatively, the fitting part may be located between the fitting portion with the external connector and the sealing part. Alternatively, the lower case 30 may have a fitting projection extending in a direction approximately parallel to the sealing part and the housing 51 may have a fitting groove corresponding to the fitting projection of the lower case 30.

In the above-described exemplary embodiment, at the connecting parts of the connector-side recess portion 53 and the connector-side protruding portion 54, the center portion of the connector-side recess portion 53 and the center portion of the connector-side protruding portion 54 are aligned, as an example. Alternatively, the center portion of the connector-side recess portion 53 and the center portion of the connector-side protruding portion 54 may be out of alignment as long as the connector-side recess portion 53 and the connector-side protruding portion 54 are connected to each other.

In the above-described exemplary embodiment, the nesting parts 37 of the lower case 30 are locked into an inner wall of the connector-side recess portion 53 at the connecting parts of the connector-side recess portion 53 and the connector-side protruding portion 54 for increasing the length of the leak path by the nesting parts 37 and the connector-side protruding portion 54. Alternatively, the lower case 30 may not have the nesting parts 37. Alternatively, the housing 51 may have a nesting part adjacent to the connector-side recess portion 53 and the nesting part, the connector-side protruding portion 54 and the second protruding part 25b of the upper case 20 may be inserted into the second recess part 35b of the lower case 30 for increasing the length of the leak path. That is, the connector-side recess portion 53, the connector-side protruding portion 54, the second protruding part 25b and the second recess part 35b may be used as nesting parts for increasing the length of the leak path.

Such changes and modifications are to be understood as being within the scope of the present invention as defined by the appended claims.

What is claimed is:

1. An electronic device comprising:
a printed circuit board having a first surface and a second surface and including a plurality of lands;
a connector disposed on the first surface of the printed circuit board and including a housing and a plurality of terminals, the plurality of terminals arranged in the housing and electrically coupled with the plurality of lands respectively for electrically coupling the printed circuit board and an external connector;
a casing including a first case disposed on the first-surface side of the printed circuit board and a second case disposed on the second-surface side of the printed circuit board, the casing having a connector opening defined by an open edge portion of the first case and an open edge portion of the second case, the casing housing the printed circuit board and a part of the connector in such a manner that the other part of the connector protrudes from the connector opening to an outside of the casing; and
a sealing member disposed between a peripheral edge portion of the first case and an peripheral edge portion of the second case and between the open edge portions of the casing and a surface of the housing so that an inside of the casing is waterproof, wherein:
the casing has a sealing part coming in contact with the sealing member;
the sealing part of the casing includes a casing-side recess portion and a casing-side protruding portion;
the casing-side recess portion extends from one longitudinal end to the other longitudinal end of the open edge portion of one of the cases;
the casing-side protruding portion extends from one longitudinal end to the other longitudinal end of the open edge portion of the other case;
the housing has a sealing part coming in contact with the sealing member and extending on the surface of the housing so as to have a loop shape;
the sealing part of the housing includes a connector-side protruding portion and a connector-side recess portion that are connected to each other;
the connector-side protruding portion is fitted into the casing-side recess portion through the sealing member; and
the casing-side protruding portion is fitted into the connector-side recess portion through the sealing member.

2. The electronic device according to claim 1, wherein:
the casing-side recess portion is continuously disposed at the open edge portion and the peripheral edge portion of the one case;
the casing-side protruding portion is continuously disposed at the open edge portion and the peripheral edge portion of the other case; and
a part of the casing-side protruding portion disposed at the peripheral edge portion of the other case is fitted into a part of the casing-side recess portion disposed at the peripheral edge portion of the one case through the sealing member.

3. The electronic device according to claim 2, wherein:
the one case having the casing-side recess portion is the second case; and
the connector-side protruding portion is disposed at a part of the surface of the housing that faces the open edge portion of the second case.

4. The electronic device according to claim 3, wherein
the plurality of terminals extends from the housing in such a manner that a distance between a portion of the housing where the external connector is fitted with and a portion of the housing where each terminal extends from increases toward an opposite side of the first surface of the printed circuit board.

5. The electronic device according to claim 1, wherein
the housing has a first fitting part at a portion adjacent to the sealing part of the housing;
the casing has a second fitting part at a portion facing the first fitting part;
one of the fitting parts is a fitting projection and the other one of the fitting parts is a fitting groove; and
the fitting projection is fitted into the fitting groove.

6. The electronic device according to claim 5, wherein
the second fitting part of the casing extends in a direction approximately parallel to the extending direction of the sealing part of the housing.

7. The electronic device according to claim 5, wherein:
the first fitting part is disposed at two longitudinal end portions of the housing; and
the second fitting part is disposed to face the two longitudinal end portions of the housing.

8. The electronic device according to claim 5, wherein
the first fitting part and the second fitting part are configured in such a manner that the first fitting part is fitted with the second fitting part before the connector-side protruding portion is inserted into the casing-side recess portion or before the casing-side protruding portion is inserted into the connector-side recess portion when the casing is assembled to house the printed circuit board and the part of the connector.

9. The electronic device according to claim 1, wherein:
the sealing part of the housing has an approximately trapezoid contour including a first base and a second base;
the first base and the second base are arranged approximately parallel to the first surface of the printed circuit board;
the second base is longer than the first base; and
a part of the sealing part of the casing that faces the second base is disposed on one plane.

10. The electronic device according to claim 1, wherein:
the sealing part of the housing has an approximately hexagonal contour including a first side part and a second side part that are arranged approximately parallel to the first surface of the printed circuit board; and
the connector-side protruding portion and the connector-side recess portion are connected each other at vertices of the approximate hexagonal contour.

11. The electronic device according to claim 10, wherein:
the plurality of terminals are arranged in the housing in a zigzag manner in a longitudinal direction of the housing;
the plurality of terminals are arranged in a plurality of rows in a thickness direction of the printed circuit board at least at a portion adjacent to a longitudinal end of the housing;
the plurality of rows is greater than or equal to three rows; and
the terminal that is closest to the longitudinal end of the housing among the plurality of terminals is located in a middle row in the thickness direction of the printed circuit board.

12. The electronic device according to claim 10, wherein:
the plurality of terminals are arranged in the housing in a zigzag manner in a longitudinal direction of the housing;
the plurality of terminals are arranged in a plurality of rows in a thickness direction of the printed circuit board at least at a portion adjacent to a longitudinal end of the housing;
the plurality of rows is greater than or equal to three rows;
each row has an end terminal that is closest to the longitudinal end of the housing among the terminals in each row;
the end terminal in a row that is the closest to the first side part of the sealing part is farthest from the longitudinal end of the housing among the end terminals; and
the connector-side recess portion is disposed at the first side part of the sealing part.

13. The electronic device according to claim 10, wherein:
the one case having the casing-side recess portion has two nesting parts that are respectively disposed at the two longitudinal end of the open edge portion; and
the nesting parts are fitted into the connector-side recess portion at the connecting part of the connector-side recess portion with the connector-side protruding portion.

14. The electronic device according to claim 1, wherein the a casing-side protruding portion has a proximal end that is fixed to the casing and a distal end that extends in an inward direction towards a central axis of the casing, and the connector-side protruding portion has a proximal end that is fixed to the connector and a distal end that extends in an outward direction away from a central axis of the connector.

15. An electronic device comprising:
a printed circuit board having a first surface and a second surface and including a plurality of lands;
a connector located on the first surface of the printed circuit board, wherein the connector includes a housing and a plurality of terminals, and the plurality of terminals are arranged in the housing and electrically coupled with the plurality of lands, respectively, for electrically coupling the printed circuit board and an external connector;
a casing including a first case, which is located on a first side of the printed circuit board, and a second case, which is located on a second side of the printed circuit board, wherein the first side of the printed circuit board is opposite to the second side of the printed circuit board, and wherein the casing includes a connector opening defined by an open edge portion of the first case and an open edge portion of the second case, and the casing houses the printed circuit board and an inner part of the connector in such a manner that an outer part of the connector protrudes from the connector opening to an outside of the casing; and
a sealing member located between a peripheral edge portion of the first case and a peripheral edge portion of the second case and between the open edge portions of the casing and a surface of the housing of the connector so that water is prevented from entering an inside of the casing, wherein:
the casing has a sealing part that contacts the sealing member;
the sealing part of the casing includes a casing-side recess and a casing-side protrusion, wherein the casing-side protrusion protrudes in an inward direction toward the connector;
the casing-side recess extends from one end to an opposite end of the open edge portion of a first one of the cases;
the casing-side protrusion extends from one end to an opposite end of the open edge portion of the a second one of the cases;

the housing has a sealing part that contacts the sealing member and extends in a loop around the surface of the housing;

the sealing part of the housing includes a connector-side protrusion and a connector-side recess that are connected to each other, and the connector-side protrusion protrudes in an outward direction toward the casing;

the connector-side protrusion is fitted into the casing-side recess so that the sealing member is located between a distal end of the connector-side protrusion and a surface that forms the casing-side recess; and the casing-side protrusion is fitted into the connector-side recess so that the sealing member is located between a distal end of the casing-side protrusion and a surface that forms the connector-side recess.

* * * * *